(12) United States Patent
Takashima et al.

(10) Patent No.: US 10,903,352 B2
(45) Date of Patent: Jan. 26, 2021

(54) MANUFACTURING METHOD OF VERTICAL GAN-BASED SEMICONDUCTOR DEVICE AND VERTICAL GAN-BASED SEMICONDUCTOR DEVICE

(71) Applicant: FUJI ELECTRIC CO., LTD., Kanagawa (JP)

(72) Inventors: Shinya Takashima, Hachioji (JP); Katsunori Ueno, Matsumoto (JP); Masaharu Edo, Tokorozawa (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/177,434

(22) Filed: Nov. 1, 2018

(65) Prior Publication Data
US 2019/0157448 A1   May 23, 2019

(30) Foreign Application Priority Data
Nov. 22, 2017   (JP) .................................. 2017-225218

(51) Int. Cl.
*H01L 29/78* (2006.01)
*H01L 29/20* (2006.01)
(Continued)

(52) U.S. Cl.
CPC .... *H01L 29/7813* (2013.01); *H01L 21/02389* (2013.01); *H01L 21/2233* (2013.01);
(Continued)

(58) Field of Classification Search
CPC ............. H01L 29/7813; H01L 29/4236; H01L 21/3245; H01L 21/2233; H01L 21/02389;
(Continued)

(56) References Cited

U.S. PATENT DOCUMENTS

2005/0048685 A1* 3/2005 Shibata ................... C30B 25/18
  438/46
2008/0185608 A1* 8/2008 Chitnis ............... H01L 33/0079
  257/99

(Continued)

OTHER PUBLICATIONS

Yuki Niiyama et al.,"Normally off operation GaN-based MOSFETs for power electronics applications", Semiconductor Science and Technology, Nov. 10, 2010, vol. 25, 125006, p. 1-14.
(Continued)

*Primary Examiner* — Marcos D. Pizzaro
*Assistant Examiner* — Sue Tang

(57) ABSTRACT

A manufacturing method of a vertical GaN-based semiconductor device having: a GaN-based semiconductor substrate; a GaN-based semiconductor layer including a drift region having doping concentration of an n type impurity, which is lower than that of the GaN-based semiconductor substrate, and is provided on the GaN-based semiconductor substrate; and MIS structure having the GaN-based semiconductor layer, an insulating film contacting the GaN-based semiconductor layer, and a conductive portion contacting the insulating film, the method includes: implanting an n type dopant in a back surface of the GaN-based semiconductor substrate after forming of the MIS structure, and annealing the GaN-based semiconductor substrate after the implanting of the n type dopant.

5 Claims, 7 Drawing Sheets

(51) Int. Cl.
- *H01L 29/04* (2006.01)
- *H01L 29/08* (2006.01)
- *H01L 21/02* (2006.01)
- *H01L 21/223* (2006.01)
- *H01L 21/324* (2006.01)
- *H01L 29/423* (2006.01)
- *H01L 29/66* (2006.01)
- *H01L 29/10* (2006.01)

(52) U.S. Cl.
CPC ........ *H01L 21/3245* (2013.01); *H01L 29/045* (2013.01); *H01L 29/0865* (2013.01); *H01L 29/2003* (2013.01); *H01L 29/4236* (2013.01); *H01L 29/66712* (2013.01); *H01L 29/7802* (2013.01); *H01L 29/1095* (2013.01); *H01L 29/66734* (2013.01)

(58) Field of Classification Search
CPC ............... H01L 29/0865; H01L 29/045; H01L 29/2003; H01L 29/66734; H01L 29/1095; H01L 29/7802; H01L 29/66712
See application file for complete search history.

(56) References Cited

U.S. PATENT DOCUMENTS

| | | | |
|---|---|---|---|
| 2015/0263157 A1* | 9/2015 | Fujimoto | H01L 29/7395 257/329 |
| 2017/0271148 A1* | 9/2017 | Takashima | H01L 21/02389 |
| 2018/0019348 A1* | 1/2018 | Yu | H01L 21/265 |

OTHER PUBLICATIONS

Tetsuo Narita et al., "P-type doping of GaN(000-1) by magnesium ion implantation", Applied Physics Express, Dec. 1, 2016, 10, vol. 10, 016501, p. 1-4.

* cited by examiner

MANUFACTURING METHOD OF VERTICAL GAN-BASED SEMICONDUCTOR DEVICE AND VERTICAL GAN-BASED SEMICONDUCTOR DEVICE

The contents of the following Japanese patent application(s) are incorporated herein by reference:
NO. 2017-225218 filed in JP on Nov. 22, 2017.

BACKGROUND

1. Technical Field

The present invention relates to a manufacturing method of a vertical GaN-based semiconductor device and a vertical GaN-based semiconductor device.

2. Related Art

It is known to provide a cap layer on a GaN layer in order to activate ion-implanted dopants when a gallium nitride (hereinafter, referred to as GaN) layer is heat annealed (refer to Non-Patent Document 1, for example). Also, if a protective layer is not provided on a (000-1) plane and a (0001) plane of a GaN substrate, each having magnesium (Mg) ion implanted therein, and if the GaN substrate is annealed for 30 seconds at 1230° C. in nitrogen gas, it is known that nitrogen is unlikely to be removed from the (000-1) plane of the GaN substrate compared with the (0001) plane thereof, and is thermally stable compared with the (0001) plane (refer to Non-Patent Document 2, for example). Note that, in Non-Patent Document 2, a horizontal line is added to a number "1" as a superscript instead of an expression of "-1". However, it should be noted that regardless of using "-1" or using a horizontal line added to the number "1" as a superscript, they have the same meaning. In this specification, the expression of "-1" is used instead of adding a horizontal line to a number "1" as a superscript.

PRIOR ART DOCUMENTS

Patent Documents

[Non-Patent Document 1]
Yuki Niiyama et al., "Normally off operation GaN-based MOSFETs for power electronics applications", Semiconductor Science and Technology, Nov. 10, 2010, vol. 25, 125006
[Non-Patent Document 2]
Tetsuo Narita et al., "P-type doping of GaN (000-1) by magnesium ion implantation", Applied Physics Express, Dec. 1, 2016, 10, vol. 10, 016501

Resistance of a GaN-based semiconductor substrate is a cause of ON resistance of a vertical GaN-based semiconductor device. In a vertical GaN-based semiconductor device, it is desirable to reduce ON resistance.

SUMMARY

A first aspect of the present invention provides a manufacturing method of a vertical GaN-based semiconductor device. The vertical GaN-based semiconductor device may have a GaN-based semiconductor substrate, a GaN-based semiconductor layer, and MIS structure. The GaN-based semiconductor layer may include a drift region. The GaN-based semiconductor layer may be provided on the GaN-based semiconductor substrate. The drift region may have doping concentration of an n type impurity, which is lower than that of the GaN-based semiconductor substrate. The MIS structure may have a GaN-based semiconductor layer, an insulating film contacting the GaN-based semiconductor layer, and a conductive portion contacting the insulating film. The manufacturing method of the vertical GaN-based semiconductor device may include: forming MIS structure; implanting n type dopants in a back surface of the GaN-based semiconductor substrate; and annealing the GaN-based semiconductor substrate. The implanting of the n type dopants in the back surface of the GaN-based semiconductor substrate may be performed after the forming of MIS structure. The annealing of the GaN-based semiconductor substrate may be performed after the implanting of the n type dopants.

A back surface of the GaN-based semiconductor substrate may have heat resistance higher than that of a gallium polarity plane.

The back surface of the GaN-based semiconductor substrate may be a nitride polarity plane or an m plane.

In the annealing of the GaN-based semiconductor substrate, the GaN-based semiconductor substrate may be annealed without providing a protective layer contacting the back surface.

In the annealing of the GaN-based semiconductor substrate, the GaN-based semiconductor substrate may be annealed by irradiating the back surface with a laser beam.

Thinning the GaN-based semiconductor substrate may be further included before the implanting of the n type dopants in the back surface and the annealing of the GaN-based semiconductor substrate.

In the annealing of the GaN-based semiconductor substrate, the GaN-based semiconductor substrate may be annealed at a predetermined temperature from 1000° C. to 1350° C.

In the implanting of the n type dopants in a back surface of the GaN-based semiconductor substrate, at least one type of elements including silicon, germanium, and oxygen may be implanted in the back surface.

A second aspect of the present invention provides a vertical GaN-based semiconductor device. The vertical GaN-based semiconductor device may have a GaN-based semiconductor substrate, a GaN-based semiconductor layer, and MIS structure. The GaN-based semiconductor layer may include a drift region. The GaN-based semiconductor layer may be provided on the GaN-based semiconductor substrate. The drift region may have doping concentration of an n type dopant lower than that of the GaN-based semiconductor substrate. The MIS structure may have the GaN-based semiconductor layer, an insulating film contacting the GaN-based semiconductor layer, and a conductive portion contacting the insulating film. Doping concentration of an n type dopant in a lower region may have doping concentration higher than doping concentration of an n type dopant in an upper region. The lower region may be provided from a predetermined depth position to a back surface of the GaN-based semiconductor substrate. The upper region may be provided above the predetermined depth position of the GaN-based semiconductor substrate.

The back surface of the GaN-based semiconductor substrate may have heat resistance higher than that of a gallium polarity plane.

The back surface of the GaN-based semiconductor substrate may be a nitride polarity plane or an m plane.

A peak of the doping concentration of the n type dopant in the depth direction of the lower region may be $1E+19$ $cm^{-3}$ or more.

In the predetermined direction of the back surface, carrier concentration of the lower region may periodically change.

Note that, the summary clause described above does not necessarily describe all necessary features of the embodiments of the present invention. The present invention may also be a sub-combination of the features described above.

DESCRIPTION OF EXEMPLARY EMBODIMENTS

Hereinafter, the present invention will be described with reference to embodiments of the invention. However, the following embodiments should not be construed as limiting the claimed invention. Also, not all the combinations of features described in the embodiments are necessarily essential to means to solve problems provided by aspect of the invention.

Figure 1:
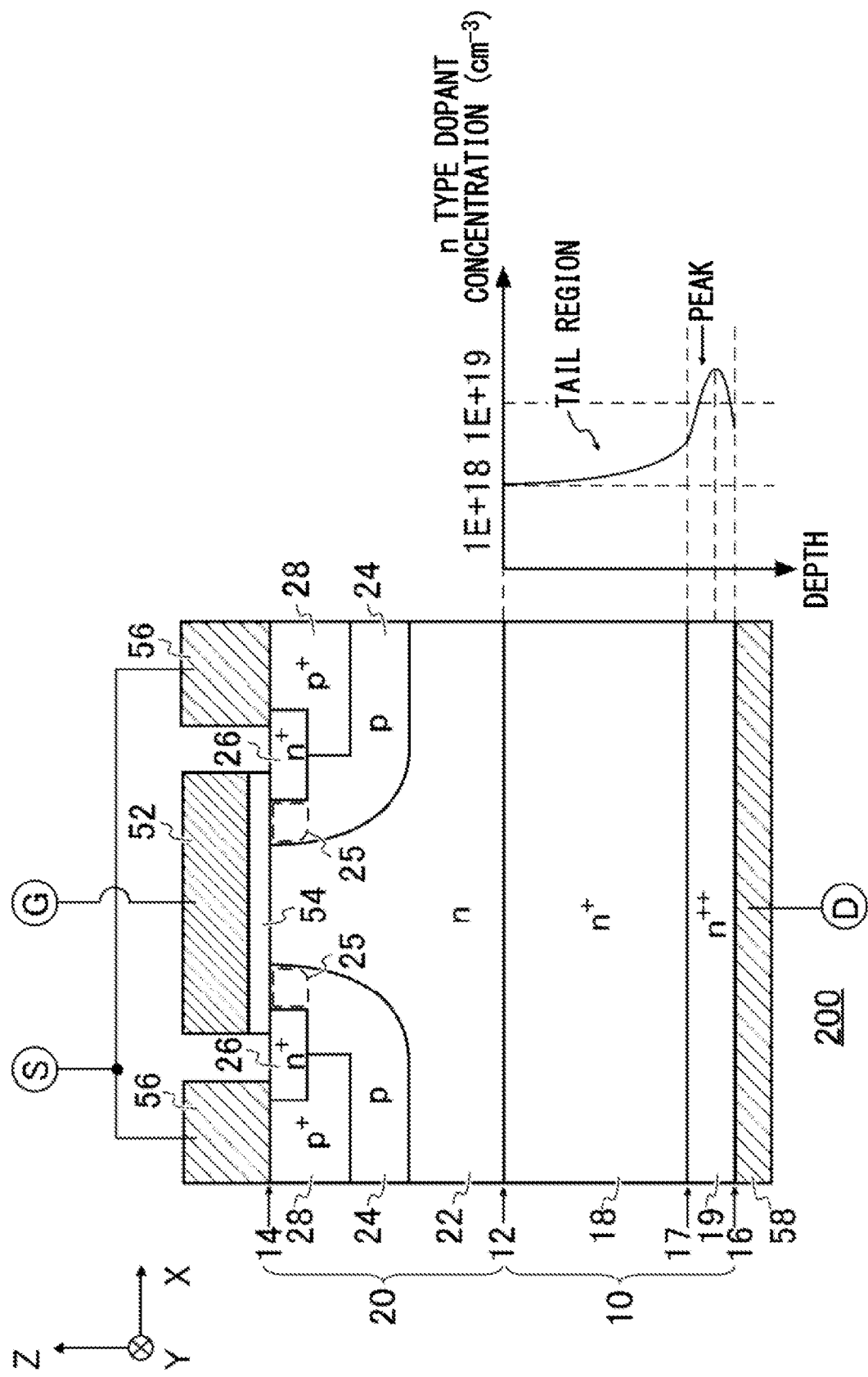
FIG. 1 illustrates a cross-section of a vertical MOSFET 200 according to a first embodiment.

FIG. 1 illustrates a cross-section of a vertical MOSFET 200 according to a first embodiment. FIG. 1 may be a cross-section X-Z passing through an active region in a GaN-based semiconductor chip. The GaN-based semiconductor chip may have the active region and an edge termination region provided around an X-Y plane of the active region. The vertical MOSFET 200 may be provided in the active region of the GaN-based semiconductor chip.

In the present example, an X axis and a Y axis are axes orthogonal to each other. A Z axis is an axis orthogonal to the X-Y plane. The X, Y, and Z axes constitute so-called the right handed system. A front surface 14 and a back surface 16 of the present example are parallel to the X-Y plane. In the present example, the positive direction of the Z axis (+Z direction) may be referred to as "upper", and the negative direction of the Z axis (−Z direction) may be referred to as "lower". Note that, the terms "upper" and "lower" are not necessarily associated with the vertical direction to the ground. That is, "upper" and "lower" directions are not limited to the gravity direction. The terms "upper" and "lower" are merely used conveniently to specify the relative positions of regions, layers, films, substrates and the like.

The vertical MOSFET 200 of the present example has double diffusion MOS (DMOS: Double Diffusion Metal Oxide Semiconductor) structure. The vertical MOSFET 200 of the present example is one example of a vertical GaN-based semiconductor device. The vertical MOSFET 200 of the present example has: a GaN substrate 10 of $n^+$ type; a GaN layer 20; a gate insulating film 54; a gate electrode 52; source electrodes 56; and a drain electrode 58.

In the present example, the GaN-based semiconductor is composed of GaN. However, the GaN-based semiconductor may include one or more elements including aluminum (Al) and indium (In). That is, a composition formula of the GaN-based semiconductor may be a mixed crystal semiconductor including a small amount of Al and In, i.e., $Al_xIn_yGa_{1-x-y}N$ ($0 \leq x < 1$, $0 \leq y < 1$). Note that, the composition formula of the GaN-based semiconductor of the present example is GaN, which is obtained from the formula of $Al_xIn_yGa_{1-x-y}N$ where $x=y=0$.

P type dopants for the GaN-based semiconductor may be one or more elements of magnesium (Mg), calcium (Ca), beryllium (Be), and zinc (Zn). In the present example, Mg is used as the p type dopants. Also, n type dopants for the GaN-based semiconductor may include one or more elements of Si (silicon), Ge (germanium) and O (oxygen). In the present example, Si is used as the n type dopants.

Also, in the present example, n and p represents the majority carrier being electrons and holes respectively. The signs "+" or "−" to the right of the letters "n" or "p" mean that the "n" or "p" with "+" has a higher carrier concentration than that without "+", and the "n" or "p" with "−" has a lower carrier concentration than that without "−". For example, because doping concentration of an n type dopant in a drift region 22 is low compared with that of a GaN substrate 10, the drift region 22 is of n type and the GaN substrate 10 is of $n^+$ type. Note that, "++" means carrier concentration being higher than that with "+".

The GaN layer 20 of the present example is a homoepitaxial layer provided on the GaN substrate 10. In the present example, a boundary between the GaN substrate 10 and the GaN layer 20 is illustrated as a boundary 12. In the present example, a front surface 14 is a main surface of the GaN layer 20, which is provided opposite to the boundary 12. Also, a back surface 16 is a main surface of the GaN substrate 10, which is provided opposite to the boundary 12.

A thickness (a length in the Z axis direction) of the GaN substrate 10 may be from 50 μm to 200 μm, or more preferably, may be from 50 μm to 100 μm. The thinner the thickness of the GaN substrate 10 is, the more percentage of resistance in the GaN substrate 10 relative to ON resistance of the vertical MOSFET 200 can be reduced. Note that, the ON resistance may represent resistance of the vertical MOSFET 200 when the vertical MOSFET 200 is in an ON state. A thickness of a GaN wafer that is commercially available at the time of filing the present application generally exceeds 200 μm. For example, the thickness is from 300 μm to 400 μm. Therefore, the thickness from 50 μm to 200 μm of the GaN substrate 10 may be achieved by polishing and etching a GaN wafer.

Note that, if the thickness of the GaN substrate 10 is too thin, it is difficult to appropriately handle the GaN substrate 10 and the GaN layer 20 in the manufacturing method of the vertical MOSFET 200. In the manufacturing method, the minimum thickness of the GaN substrate 10 needed to allow appropriate handling thereof may be 50 μm.

The GaN substrate 10 of the present example includes an upper region 18 and a lower region 19. Doping concentration of an n type dopant in the lower region 19 may be higher than doping concentration of an n type dopant in the upper region 18. Also, a peak of the doping concentration of the n type dopant in the depth direction of the lower region 19 may be 1E+19 $cm^{-3}$ or more. Peak concentration in the present example is 3E+20 $cm^{-3}$. Note that, the depth direction of the present example is a direction parallel to the Z axis that extends from the front surface 14 to the back surface 16. A peak position may be at a predetermined depth position near the back surface 16.

A GaN wafer that is commercially available has n type dopants on the order of magnitude of E+18 ($cm^{-3}$), for example. Note that, in the present example, the GaN wafer and the GaN substrate refer to the same object. The GaN substrate may also refer to a part of the GaN wafer from which it is cut out. Note that, E means "power of 10", so that E+18 means $10^{18}$.

In the present example, the lower region 19 is formed by ion implanting n type dopants in the GaN wafer that is commercially available from its back surface. Note that, if using a high concentration n type GaN wafer including n type dopants on the order of magnitude of E+19 (cm$^{-3}$) or more, mismatch in lattice constants may occur between a homoepitaxial layer formed on the GaN wafer and the GaN wafer. Due to the mismatch in the lattice constants, quality of the homoepitaxial layer is prone to be deteriorated. On the other hand, because the lower region 19 is formed by ion implantation in the present example, compared with the case of using the high concentration n type GaN wafer, a high quality GaN layer 20 having less mismatch in lattice constants can be formed.

The lower region 19 of the present example is provided from a predetermined depth position 17 to a back surface 16 of the GaN substrate 10. On the other hand, the upper region 18 may be positioned above the predetermined depth position 17 of the GaN substrate 10. The upper region 18 of the present example is a region other than the lower region 19 in the GaN substrate 10. The upper region 18 may have dopant concentration on the same order of magnitude as that of the n type dopant concentration of the GaN substrate 10 before ion implantation. Concentration distribution of the n type dopant in the GaN substrate 10 is illustrated to the right of the vertical MOSFET 200. In the present example, the n type dopant concentration of the GaN substrate 10 before ion implantation is 1E+18 (cm$^{-3}$). The upper region 18 may have a region in which a part of n type dopants that are ion implanted in order to form the lower region 19 is diffused. That is, the upper region 18 may include a tail region of n type dopants that are ion implanted.

For example, if a thickness of a GaN substrate 10 is from 50 μm to 100 μm, a thickness of a lower region 19 is 10 nm or more and less than 1 μm, or more typically, 50 nm or more and less than 300 nm. A thickness of the lower region 19 may be from 0.01% to 2% of the GaN substrate 10, or may be from 0.02% to 1% of the GaN substrate 10. More typically, the thickness of the lower region 19 may be from 0.05% to 0.6% of the GaN substrate 10, or may be from 0.1% to 0.3% of the GaN substrate 10. In the present example, a portion in the GaN substrate 10 other than the lower region 19 corresponds to the upper region 18.

In one example, if a thickness of a GaN substrate 10 having resistivity of 0.01 Ωcm is 340 μm, a product of the resistivity and the thickness of a GaN substrate 10 is 0.34 mΩcm$^2$. On the other hand, in the present example, the thickness of the GaN substrate 10 is from 50 μm to 100 μm. Also, the lower region 19 of n$^{++}$ type may be provided. Accordingly, a product of resistivity and thickness in the GaN substrate 10 can be from 0.05 mΩcm$^2$ to 0.10 mΩcm$^2$, for example. A value of the product is 10% or less of characteristic ON resistance (approximately 1 mΩcm$^2$ of the vertical MOSFET 200. A thickness of a GaN substrate 10 may be defined based on resistance of a desired GaN substrate 10, by taking resistivity of the GaN substrate 10 into consideration.

The lower region 19 may be used to lower contact resistance between the drain electrode 58 and the GaN substrate 10. In one example, the contact resistance with the electrode can be lowered to 0.01 mΩcm$^2$ or less by providing a lower region 19 having peak concentration of 1E+19 cm$^{-3}$ or more.

The vertical MOSFET 200 of the present example includes MIS structure. The MIS structure of the present example has: the GaN layer 20; the gate insulating film 54 contacting the GaN layer 20; and the gate electrode 52 contacting the gate insulating film 54. The GaN layer 20 has: the drift region 22 of n type; base regions 24 of p type; source regions 26 of n$^+$ type; and contact regions 28 of p$^+$ type.

At least a part of the base region 24 may be exposed to the front surface 14 of the GaN layer 20, and contact the gate insulating film 54. The at least a part of the base region 24 may be positioned directly under the gate electrode 52, and may function as a channel forming region 25. The channel forming regions 25 are regions in which charge inversion layers are formed if a predetermined voltage is applied to the gate electrode 52 (at the time of turn-on (gate-on)). A state in which the charge inversion layers are formed is referred to as an ON state of the vertical MOSFET 200. The base regions 24 of the present example are well regions provided from the front surface 14 to predetermined depth positions shallower than the boundary 12.

At least a part of the contact region 28 may be exposed to the front surface 14 of the GaN layer 20. The contact region 28 may contact the source electrode 56 on the front surface 14. The contact region 28 may have a function of reducing contact resistance between the front surface 14 and the source electrode 56, and a function of providing a hole extracting path at the time of gate-off (turn-off). The contact region 28 of the present example is a well region provided from the front surface 14 to a predetermined depth position shallower than a bottom of the base region 24.

At least a part of the source region 26 may also be exposed to the front surface 14 of the GaN layer 20. The source region 26 may contact the gate insulating film 54 and the source electrode 56 on the front surface 14. The source region 26 may have a function of providing a low resistance path for electron current. The source region 26 of the present example is a well region provided from the front surface 14 to a predetermined depth position shallower than a bottom of the contact region 28. The source region 26 of the present example is formed by partially counter doping the base region 24 and the contact region 28.

The gate electrode 52 of the present example is a conductive layer provided on the gate insulating film 54. The gate electrode 52 is one example of a conductive portion in the MIS structure. The gate electrode 52 may be formed of aluminum (Al), or may also be formed of polysilicon including dopants. The gate insulating film 54 may be a silicon dioxide (SiO$_2$) film, or an aluminum oxide (Al$_2$O$_3$) film. A gate terminal may be electrically connected to the gate electrode 52.

The source electrodes 56 of the present example are electrode layers provided on the front surface 14. The source electrodes 56 may have stack structure of a titanium (Ti) layer that functions as a barrier metal layer contacting the front surface 14 and a metal layer composed of Al or the like contacting the Ti layer. Also, the source electrode 56 may be electrically separated from the gate electrode 52 by an interlayer dielectric film. The drain electrode 58 of the present example is an electrode layer provided below the back surface 16 so as to contact the back surface 16. The drain electrode 58 may be formed of the same material as that of the source electrodes 56.

In FIG. 1, the gate terminal, source terminals, and a drain terminal are illustrated as G, S, and D respectively. For example, if a potential of a threshold voltage or more is applied to the gate terminal via the gate electrode 52, the charge inversion layers are formed in the channel forming regions 25. For example, if the charge inversion layers are formed in the channel forming regions 25 in a case in which the drain electrode 58 has a predetermined high potential and the source electrodes 56 have the ground potential, current flows from the drain terminal to the source terminal. Also, for example, if a potential lower than a threshold voltage is applied to the gate electrode 52, the charge inversion layers disappear and current is cut off. The state in which the charge inversion layers disappear may be referred to as an OFF state of the vertical MOSFET 200. In this manner, the currents flowing between the source terminal and the drain terminal in the vertical MOSFET 200 can be controlled.

Although not illustrated in the present example, the edge termination region has structure of guard ring, field plate, RESURF, or a combination thereof, for example. The edge termination region can improve a reverse bias withstand voltage of the vertical MOSFET 200 compared to a case in which it is not provided.

Figure 2:
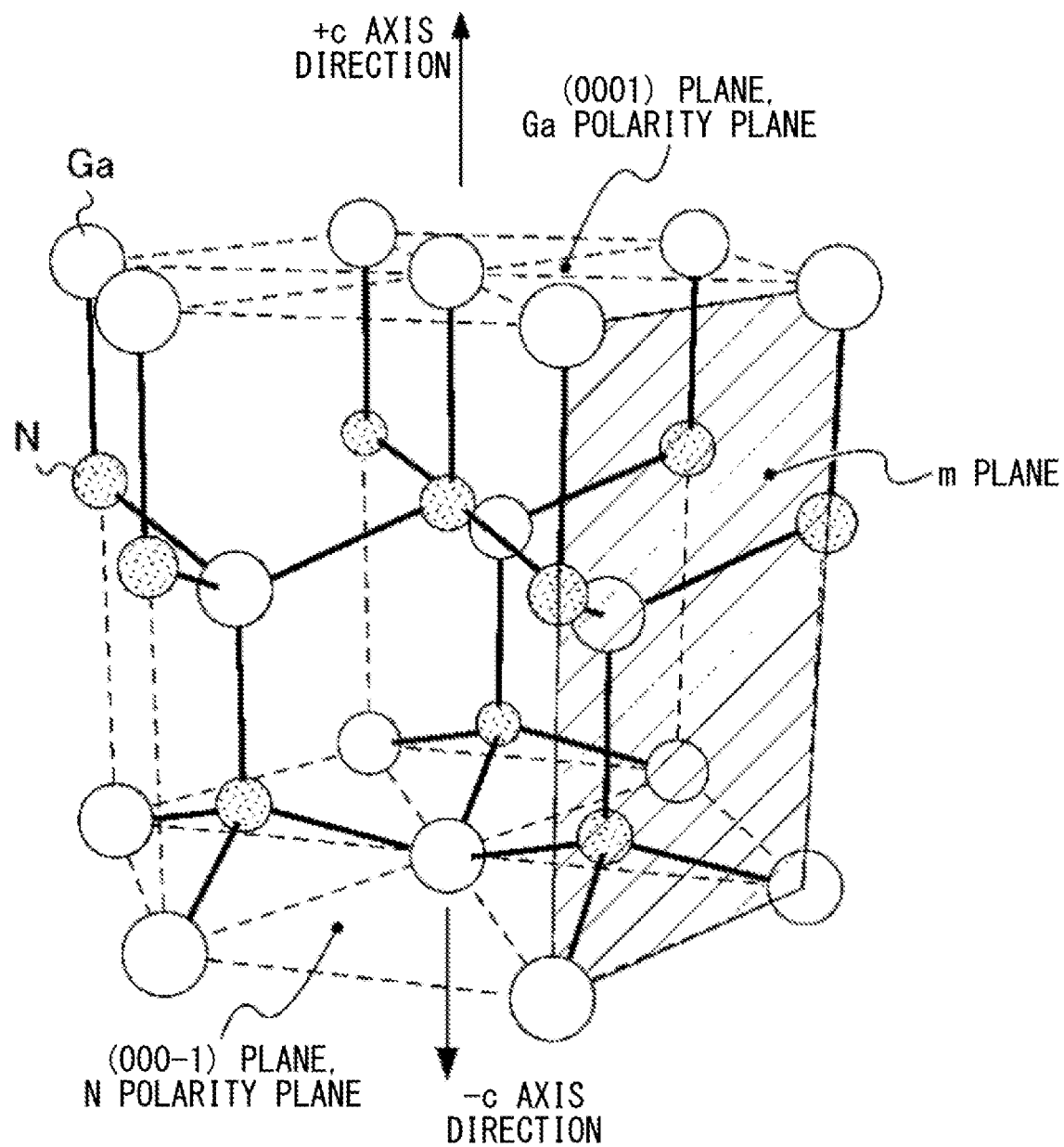
FIG. 2 illustrates a Ga polarity plane, an N polarity plane and an m plane in a GaN crystal.

FIG. 2 illustrates a Ga polarity plane, an N polarity plane and an m plane in a GaN crystal. In this specification, the Ga polarity plane means a (0001) plane of the GaN-based semiconductor, and the N polarity plane means a (000-1) plane of the GaN-based semiconductor. The (0001) plane is one plane of the GaN crystal in the +c axis direction, and the (000-1) plane is a plane of the GaN crystal in the −c axis direction. Also, the m plane is a (1-100) plane. In the present example, among a plurality of planes specified as m planes, one plane is illustrated with oblique lines. The back surface 16 of the GaN substrate 10 may have heat resistance higher than that of the Ga polarity plane. The plane having heat resistance higher than that of the Ga polarity plane is, for example, the N polarity plane or the m plane. In the present example, the front surface 14 of the GaN layer 20 is a Ga polarity plane and the back surface 16 of the GaN substrate 10 is an N polarity plane.

In the present example, having high heat resistance may mean that one or more of the following conditions are satisfied during plane observation carried out by using a SEM (Scanning Electron Microscope) image or an optical microscope to observe different crystal planes, which are annealed under the same condition: having low degree of GaN decomposition; having less number of pits; and being less porous.

Figure 3:
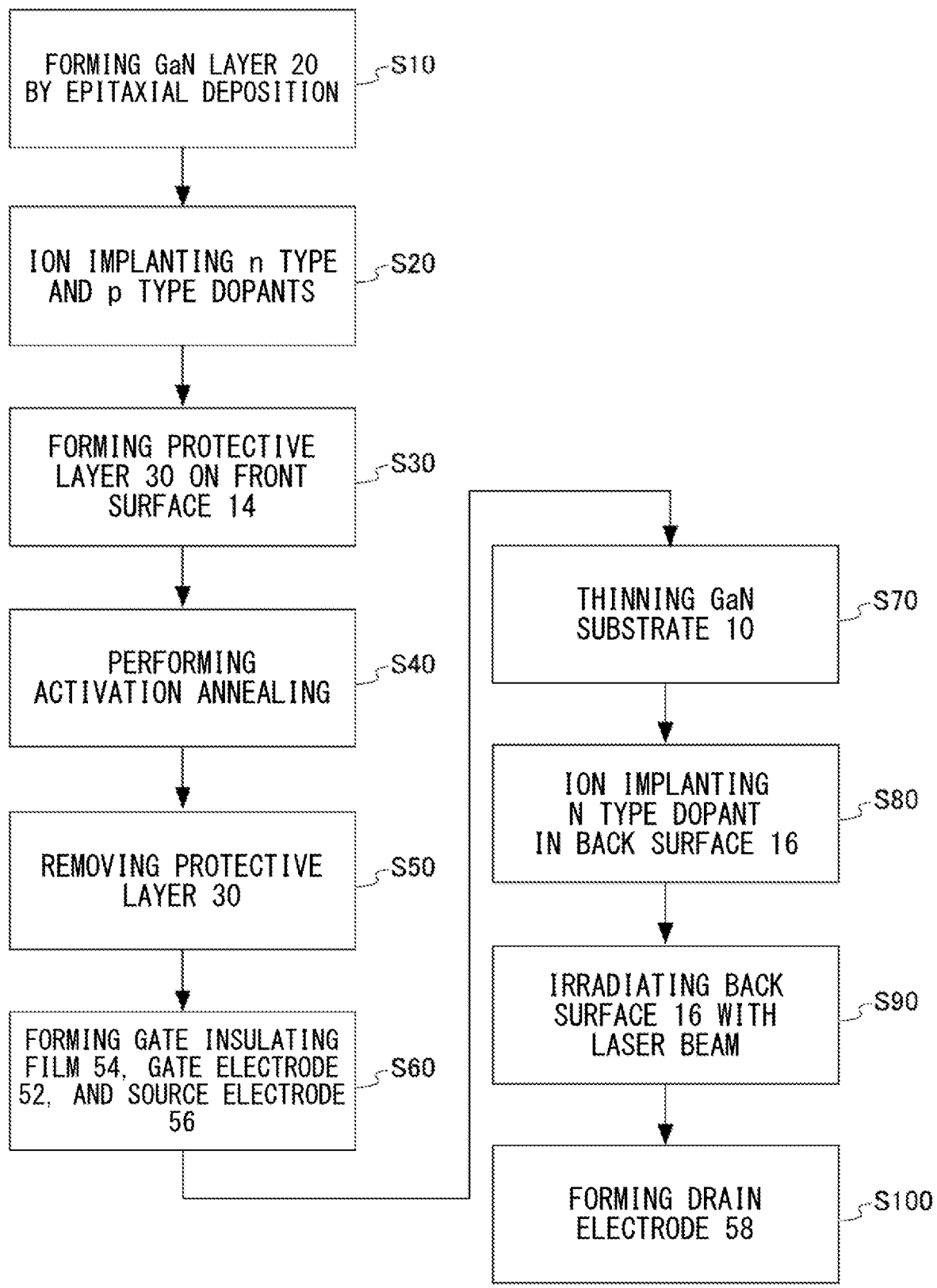
FIG. 3 illustrates a manufacturing method of a vertical MOSFET 200.

FIG. 3 illustrates a manufacturing method of a vertical MOSFET 200. The manufacturing method of the present example includes: (S10) forming a GaN layer 20 on a GaN substrate 10 by epitaxial deposition; (S20) implanting n type and p type dopants in a front surface 14; (S30) forming a protective layer 30 on the front surface 14; (S40) performing activation annealing; (S50) removing the protective layer 30; (S60) forming a gate electrode 52, a gate insulating film 54, and source electrodes 56; (S70) thinning the GaN substrate 10; (S80) implanting n type dopants in a back surface 16; (S90) annealing the GaN substrate 10 by irradiating the back surface 16 with a laser beam; and (S100) forming a drain electrode 58. In the present example, each step is sequentially performed based on its number, from small to large. Note that, in the present example, from S10 to S60 correspond to forming of MIS structure.

Figure 4:
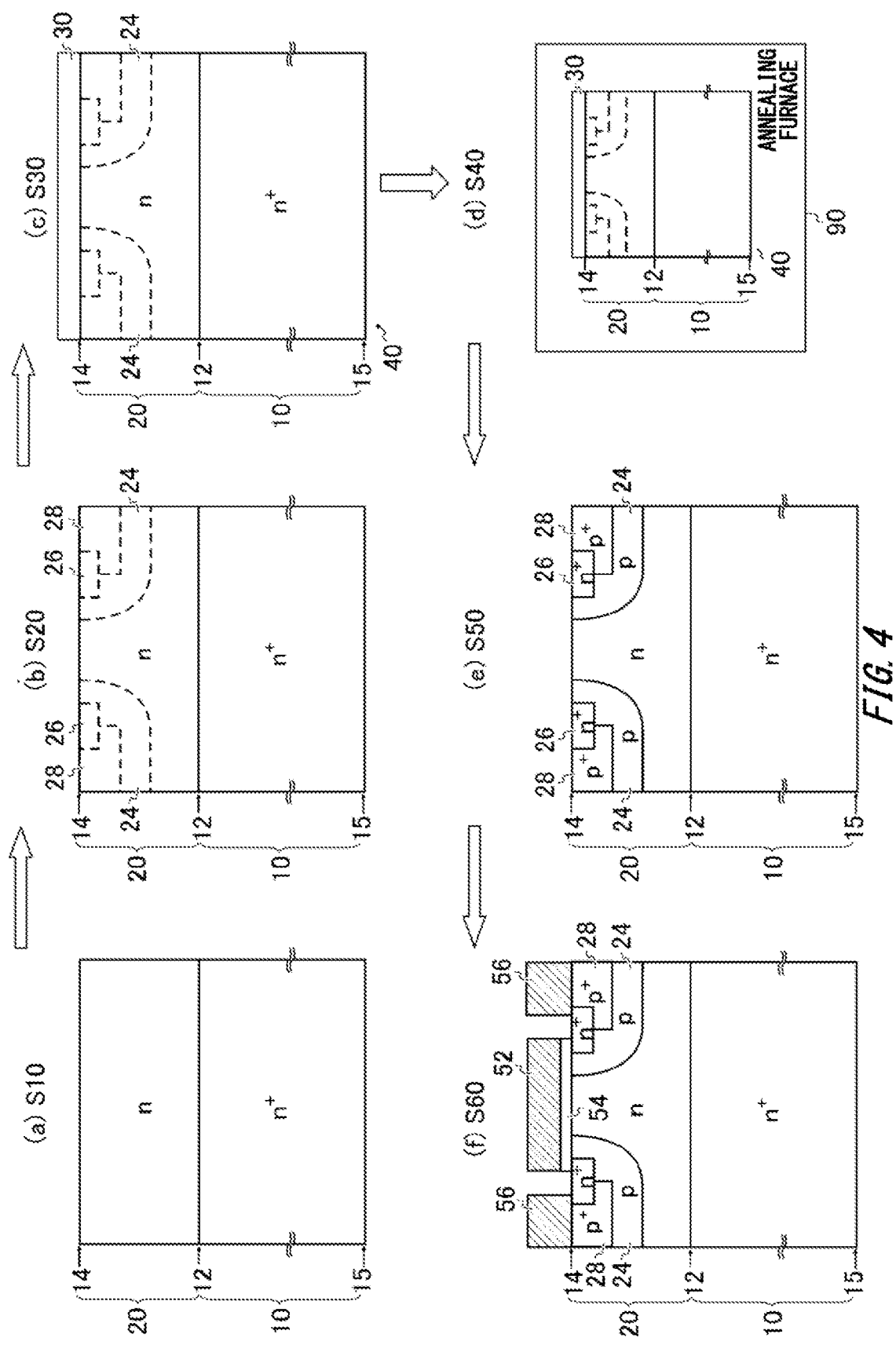
FIG. 4 illustrates S10 to S60 of the manufacturing method of the vertical MOSFET 200.

FIG. 4 illustrates S10 to S60 of the manufacturing method of the vertical MOSFET 200. The (a) of FIG. 4 illustrates S10. In S10 of the present example, a GaN layer 20 including n type dopants is formed on a GaN substrate 10 by epitaxial deposition. The GaN layer 20 may be formed by epitaxial deposition using metal organic chemical vapor deposition (MOCVD) or the like. Note that, in FIG. 4, a lower surface of the GaN substrate 10 before (S70) i.e., the thinning, is illustrated as a lower surface 15 and distinguished from a back surface 16 of the GaN substrate 10 after (S70) i.e., the thinning. In the present example, the lower surface 15 is an N polarity plane, and a front surface 14 is a Ga polarity plane. Note that, if the lower surface 15 is an N polarity plane, the back surface 16 of the GaN substrate 10 after the thinning is also an N polarity plane.

The (b) of FIG. 4 illustrates S20. In S20 of the present example, n type and p type dopants are sequentially implanted using mask material layers having apertures. For example, the p type dopants are implanted using mask material layers having apertures corresponding to base regions 24. Subsequently, p type dopants are further implanted using mask material layers having apertures corresponding to contact regions 28. After that, n type dopants are implanted using mask material layers having apertures corresponding to source regions 26. Note that, a through film may also be used, of which thickness is relatively thin in an implanted region and relatively thick in a non-implanted region. In (b) of FIG. 4, regions in which dopants are to be implanted are illustrated with dashed lines in order to indicate that dopants are yet to be activated.

The (c) of FIG. 4 illustrates S30. In S30 of the present example, a protective layer 30 is formed so as to contact the front surface 14. By providing the protective layer 30, a possibility of nitrogen (N) to be removed from a GaN layer 20 and thus a nitrogen vacancy is formed near the front surface 14 at the time of annealing using an annealing furnace 90 can be reduced. The protective layer 30 may satisfy one or more of the following conditions: having high heat resistance (a characteristic of unlikely to be decomposed at a high temperature); having excellent adhesion to the front surface 14; having impurity unlikely to be diffused from the protective layer 30 to the GaN layer 20; and being selectively removable from the GaN layer 20. In the present example, an aluminum nitride (AlN) layer satisfying all the conditions described above is used as the protective layer 30. In the present example, the GaN substrate 10, the GaN layer 20, and the protective layer 30 are referred to as a stacked body 40. Note that, in addition, a protective layer 30 contacting the lower surface 15 may also be provided.

The (d) of FIG. 4 illustrates S40. In S40 of the present example, the stacked body 40 is annealed using an annealing furnace 90 in order to activate the dopants implanted in S20. For example, the stacked body 40 is annealed at a predetermined temperature from 1100° C. to 1400° C. Accordingly, by activating the n type and p type dopants, they may function as donors and acceptors respectively. Also, defects caused by the ion implantation can be recovered to a certain degree.

The (e) of FIG. 4 illustrates S50. In S50 of the present example, the protective layer 30 is removed. In the present example, the protective layer 30 is selectively removed from the GaN layer 20 by wet etching using potassium hydroxide solution (KOHaq).

The (f) of FIG. 4 illustrates S60. In S60 of the present example, the gate electrode 52, the gate insulating film 54, and the source electrodes 56 are formed. First, a $SiO_2$ film is deposited on the front surface 14 by PECVD (Plasma-Enhanced Chemical Vapor Deposition) or the like. Then, an aluminum layer is deposited on the $SiO_2$ film by sputtering.

Next, the gate insulating film 54 can be formed by: patterning an Al layer by photolithography and etching to form a gate electrode 52; and etching the $SiO_2$ film by using the gate electrode 52 as a mask. Next, an interlayer dielectric film (not illustrated) is formed on the gate insulating film 54 to form apertures to expose the interlayer dielectric film to the source regions 26 and the contact regions 28. The source electrodes 56 can be formed by sequentially depositing the Ti layer and the Al layer on the front surface 14 and the interlayer dielectric film.

Figure 5:
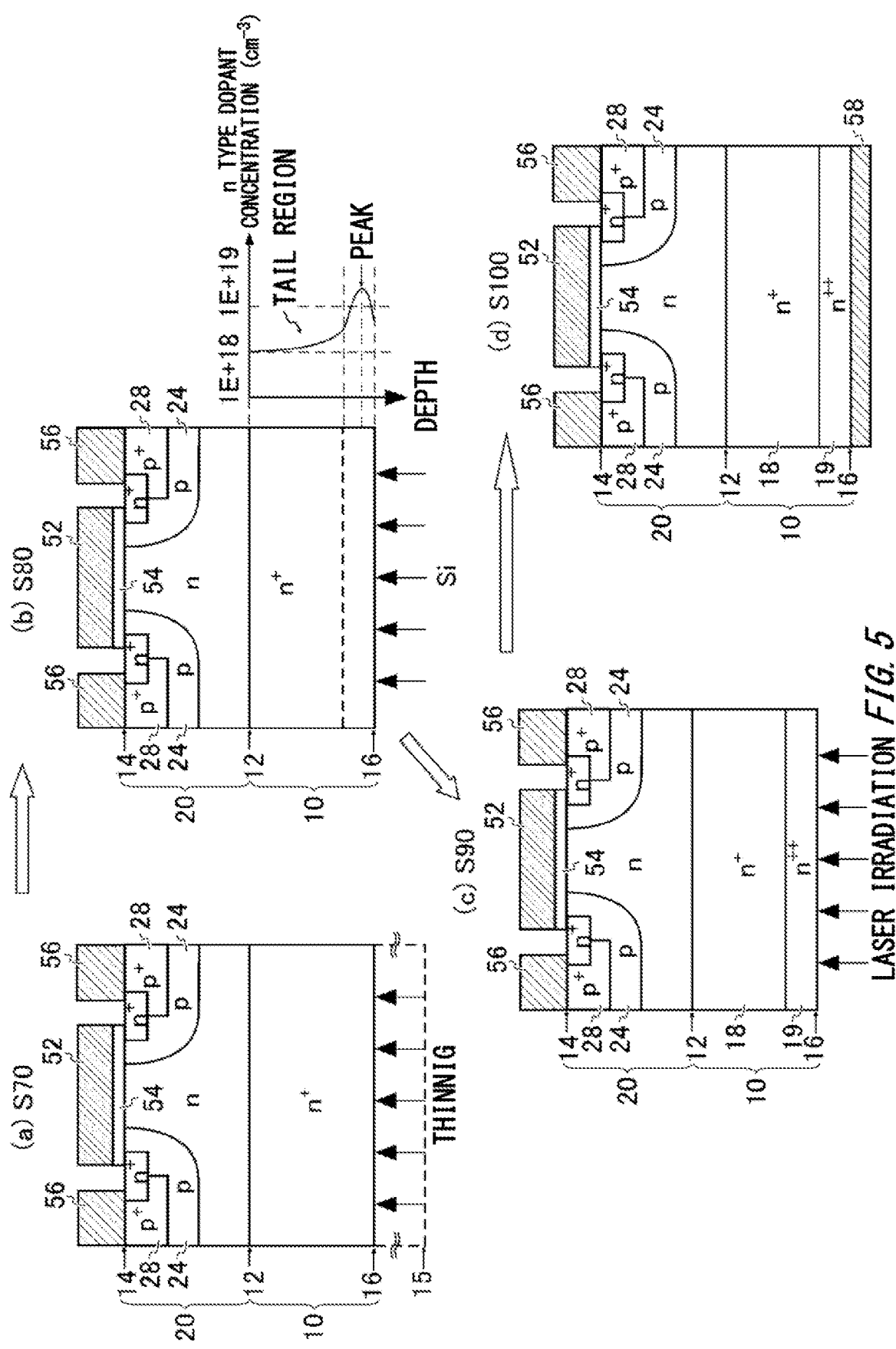
FIG. 5 illustrates S70 to S100 of the manufacturing method of the vertical MOSFET 200.

FIG. 5 illustrates S70 to S100 of the manufacturing method of the vertical MOSFET 200. The (a) of FIG. 5 illustrates S70. In S70 of the present example, the GaN substrate 10 is partially removed from the lower surface 15 to the front surface 14 of the GaN substrate 10. The thinning may be performed by any one or both of polishing and etching. In the present example, the thinning is performed on the GaN substrate having a thickness of 350 μm from the boundary 12 to the lower surface 15 so that it will be 100 μm.

The (b) of FIG. 5 illustrates S80. In S80 of the present example, Si is ion implanted in the back surface 16 at acceleration energy from 10 keV to 150 keV and osage from $1E+15$ $cm^{-2}$ to $1E+16$ $cm^{-2}$. Accordingly, a lower region 19 is formed in which concentration distribution of n type dopants has its peak in the depth direction.

The (c) of FIG. 5 illustrates S90. In S90 of the present example, the GaN substrate 10 is annealed without providing a protective layer 30 contacting the back surface 16. In S90 of the present example, linear laser light having a pulse width of 50 ns, a wavelength of 355 nm, and a fluence (that is, an energy amount per unit area) of 1.0 $J/cm^2$ is directly irradiated to the back surface 16. Accordingly, the GaN substrate 10 is annealed. By annealing using the laser light, only the temperature of the back surface 16 can be substantially raised almost without raising temperature of the structure and the region on the front surface side in which the MIS structure is included.

In S90 of the present example, the GaN substrate 10 is annealed by scanning the linear laser light on the back surface 16 in the X axis direction. In S90, the GaN substrate 10 may be annealed at a predetermined temperature from 1000° C. to 1350° C. More preferably, it may be annealed at a predetermined temperature between 1000° C. and 1250° C. inclusive. Note that, the annealing temperature in S90 of the present example may be lower than the annealing temperature in S40. In S90 of the present example, the GaN substrate 10 can be annealed at temperature at which the amount of nitrogen being removed from the GaN substrate 10 is sufficiently reduced. Also, the n type dopants implanted in the back surface 16 can be activated.

If the front surface 14 is an N polarity plane in a different case from the present example, then the back surface 16 is a Ga polarity plane. In this case, if laser annealing is performed without providing a protective layer 30 to a back surface 16 being the Ga polarity plane, nitrogen starts being removed from the back surface 16 at a temperature of less than 1000° C. Celsius. Therefore, due to the unevenness of the back surface 16 to occur, contact between the GaN substrate 10 and the drain electrode 58 may be poor. In addition, contact resistance may be increased between them. On the other hand, because the back surface 16 of the present example is an N polarity plane, it has high heat resistance compared with that of a Ga polarity plane. Therefore, even if laser annealing is performed without providing the protective layer 30 to the back surface 16, amount of nitrogen to be removed can be reduced while activating n type dopants. Also, the present example is advantageous in that, because a protective layer 30 contacting the back surface 16 is not provided, the MIS structure near the front surface 14 can be appropriately protected, and the process of removing a protective layer 30 of the back surface is not needed.

The (d) of FIG. 5 illustrates S100. In S100 of the present example, the drain electrode 58 contacting the back surface 16 is formed. In the present example, the drain electrode 58 is formed by sequentially depositing a Ti layer and an Al layer on the entire surface of the back surface 16. Accordingly, the vertical MOSFET 200 is obtained. Note that, in the present example, the drain electrode 58 is formed after irradiating the laser light to the back surface 16. However, in another example, a drain electrode 58 may be formed and subsequently a back surface 16 may be annealed by laser light through the drain electrode 58. That is, in the other example, S90 may be performed after S100. This case of the other example is advantageous compared to the example in which S100 is performed after S90 in that contact resistance can be further reduced, because the irradiation of the laser light can serve as alloying a drain electrode 58 with a GaN substrate 10, and annealing the GaN substrate 10.

Figure 6:
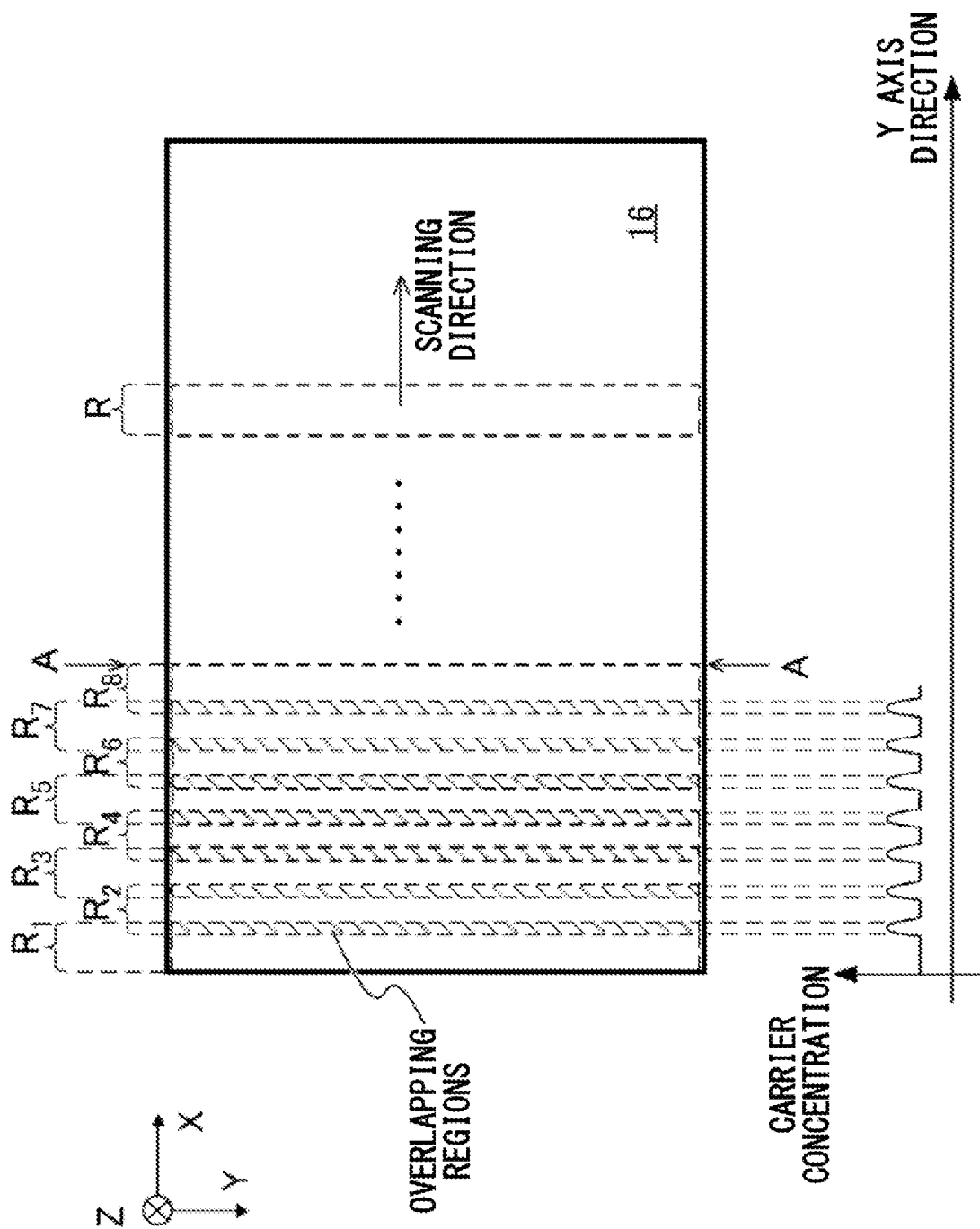
FIG. 6 illustrates a state in which a laser beam is irradiated to a back surface 16 in S90.

FIG. 6 illustrates a state in which a laser beam is irradiated to a back surface 16 in S90. FIG. 6 illustrates the entire back surface 16. A left side of A-A is a region to which linear laser light has been irradiated. On the other hand, a right side of A-A is a region before irradiating the linear laser light thereto. On the right side of A-A, a range R to which the linear laser light is irradiated in one-shot (that is, a range to which the linear laser light is irradiated when pulse width is 50 ns) is illustrated with dashed lines. In the present example, a length of the range R in the Y axis direction is equal to the length of the back surface 16 in the Y axis direction. Note that, the length of the range R in the X axis direction is sufficiently shorter than the length of the back surface 16 in the X axis direction. A length equal to or longer than tens or hundreds times the length of the range R in the X axis direction may be equal to a length of the back surface 16 in the X axis direction.

In the present example, the linear laser light is irradiated multiple times to the back surface 16. Note that, after irradiating linear laser light only once (one-shot), the range R is shifted in the +X axis direction before irradiating linear laser light once again. In this manner of sequentially repeating executing irradiation and shifting the irradiation range, the linear laser light is scanned on the back surface 16. For example, as shown in FIG. 6, the linear laser light is irradiated sequentially such as $R_1$, $R_2$, $R_3$ ... $R_8$.

In the present example, ranges R that are adjacent to each other in the X axis direction may partially overlap. In FIG. 6, the overlapping regions of the ranges R that are adjacent to each other are illustrated with oblique lines. In the present example, in S80, n type dopants are almost evenly implanted in the X-Y plane direction. Note that, because the laser annealing is performed twice in the overlapping regions of the ranges R, carrier concentration may be higher in the overlapping regions compared with non-overlapping regions. Depending on the overlapping regions, carrier concentration of the lower region 19 may periodically change in the X axis direction of the back surface 16. In the present example, a portion having relatively high carrier concentration and a portion having relatively low carrier concentration are provided alternatively in the X axis direction. Accordingly, compared to a case in which overlapping regions are not provided, n type dopants near the back surface 16 can be reliably activated. Therefore, lowering resistance is more reliably ensured.

In order to make best use of the implanted dopants, the overlapping regions of the ranges R may be periodically provided. However, the overlapping regions of the ranges R may not necessarily be provided. That is, each range R may be spaced from each other in the X axis direction by a predetermined length. Also, in either of both cases, periodical change may occur to morphology of the back surface 16. As a mere example, the overlapping regions of the ranges R may have higher degree of unevenness compared with that in the non-overlapping regions of the ranges R. Also, a range R in which linear laser light has been irradiated at least once may have higher degree of unevenness compared with that in a range to which linear laser light has not been irradiated.

Figure 7:
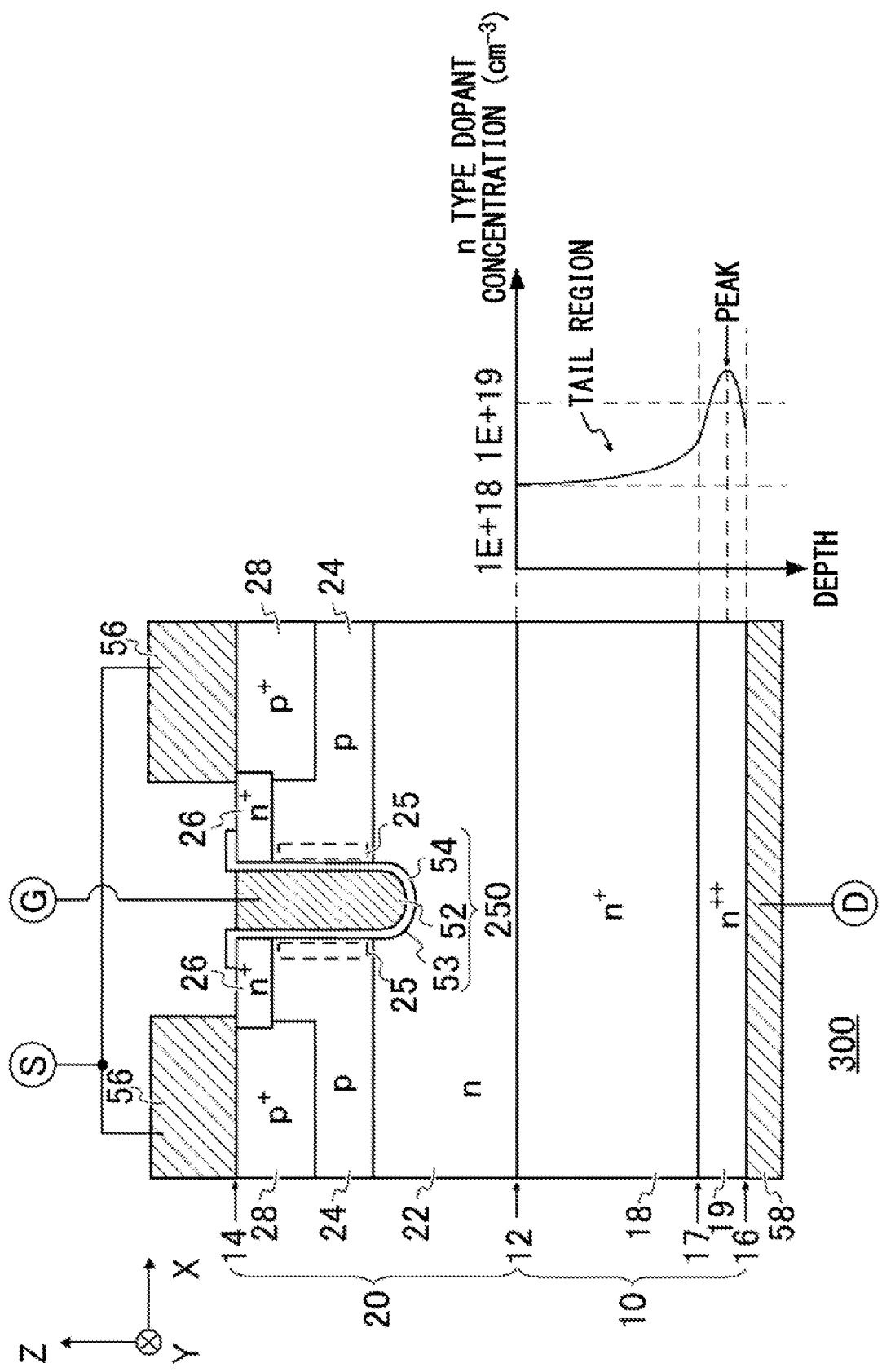
FIG. 7 illustrates a cross-section of a vertical MOSFET 300 according to a second embodiment.

FIG. 7 illustrates a cross-section of a vertical MOSFET 300 according to a second embodiment. MIS structure of the second embodiment has a gate trench portion 250. In this regard, the second embodiment is mainly different from the first embodiment. The gate trench portion 250 of the present example has a gate electrode 52, a gate trench 53, and a gate insulating film 54. The gate trench 53 may be provided extending to a position deeper than the bottom of a base region 24 from a front surface 14. The gate insulating film 54 may be provided covering the inner wall of the gate trench 53. The gate electrode 52 may be provided inside the gate insulating film 54 in the gate trench 53. The gate insulating film 54 may insulate the gate electrode 52 from a GaN layer 20. Source regions 26 may be provided contacting the side walls of the gate trench 53. In the present example, the base region 24 may be provided over the entire X-Y plane of the GaN layer 20 in an active region. A channel forming region 25 contacts a side wall of the gate trench 53 in the base region 24 and may be positioned below the source region 26. The second embodiment is the same as the first embodiment otherwise.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A vertical GaN-based semiconductor device comprising:
   a GaN-based semiconductor substrate;
   a GaN-based semiconductor layer including a drift region having doping concentration of an n type dopant lower than that of the GaN-based semiconductor substrate, and is provided on the GaN-based semiconductor substrate; and
   MIS structure having the GaN-based semiconductor layer, an insulating film contacting the GaN-based semiconductor layer, and a conductive portion contacting the insulating film, wherein
   doping concentration of an n type dopant in a lower region provided from a predetermined depth position to a back surface of the GaN-based semiconductor substrate is higher than doping concentration of an n type dopant in an upper region provided above the predetermined depth position of the GaN-based semiconductor substrate, and
   the lower region includes a peak in the doping concentration, the doping concentration at the peak being higher than or equal to the doping concentration at the back surface and higher than the doping concentration at the predetermined depth position, and the upper region includes a tail region in the doping concentration, the doping concentration in the tail region decreasing from the predetermined depth position toward the GaN-based semiconductor layer.

2. The vertical GaN-based semiconductor device according to claim 1, wherein the back surface of the GaN-based semiconductor substrate has heat resistance higher than that of a gallium polarity plane.

3. The vertical GaN-based semiconductor device according to claim 1, wherein the back surface of the GaN-based semiconductor substrate is a nitrogen polarity plane or an m plane.

4. The vertical GaN-based semiconductor device according to claim 1, wherein a peak of doping concentration of an n type dopant in a depth direction of the lower region is $1E+19$ cm$^{-3}$ or more.

5. The vertical GaN-based semiconductor device according to claim 1, wherein carrier concentration of the lower region periodically changes in a predetermined direction of the back surface.

* * * * *